United States Patent
Lai et al.

(10) Patent No.: US 7,729,118 B2
(45) Date of Patent: Jun. 1, 2010

(54) MINIATURE LIQUID COOLING DEVICE HAVING AN INTEGRAL PUMP

(75) Inventors: Cheng-Tien Lai, Taipei Hsien (TW); Zhi-Yong Zhou, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 803 days.

(21) Appl. No.: 11/556,618

(22) Filed: Nov. 3, 2006

(65) Prior Publication Data

US 2008/0104992 A1    May 8, 2008

(51) Int. Cl.
*H05K 7/20* (2006.01)
*F04B 35/04* (2006.01)
*F28F 7/00* (2006.01)
*H02K 9/00* (2006.01)
*F28D 15/00* (2006.01)
*F25D 17/02* (2006.01)

(52) U.S. Cl. ............... 361/699; 361/720; 361/702; 165/80.4; 165/104.33; 417/423.1; 417/423.7; 310/54; 62/435

(58) Field of Classification Search .......... 361/698
See application file for complete search history.

(56) References Cited

U.S. PATENT DOCUMENTS

| | | | | |
|---|---|---|---|---|
| 4,748,495 A | * | 5/1988 | Kucharek | 257/713 |
| 5,316,077 A | * | 5/1994 | Reichard | 165/104.28 |
| 5,423,376 A | * | 6/1995 | Julien et al. | 165/80.4 |
| 5,583,746 A | * | 12/1996 | Wang | 361/697 |
| 5,731,954 A | * | 3/1998 | Cheon | 361/699 |
| 5,971,725 A | * | 10/1999 | de Simon et al. | 417/423.8 |
| 6,036,453 A | * | 3/2000 | Zepp et al. | 417/410.4 |
| 6,050,785 A | * | 4/2000 | Horng | 417/354 |
| 6,109,890 A | * | 8/2000 | Horng | 417/423.14 |
| 6,309,190 B1 | * | 10/2001 | Chen | 417/423.1 |
| 6,400,053 B1 | * | 6/2002 | Horng | 310/91 |
| 6,527,522 B2 | * | 3/2003 | Chen | 417/355 |
| 6,575,231 B1 | * | 6/2003 | Wu | 165/121 |
| 6,951,449 B2 | * | 10/2005 | Huang et al. | 417/368 |
| 7,016,195 B2 | * | 3/2006 | Ito et al. | 361/699 |

(Continued)

FOREIGN PATENT DOCUMENTS

TW    M254521    1/2005

*Primary Examiner*—Jayprakash N Gandhi
*Assistant Examiner*—Bradley H Thomas
(74) *Attorney, Agent, or Firm*—Jeffrey T. Knapp

(57) ABSTRACT

A liquid cooling device includes a casing having an outer wall, a bottom base attached to a bottom end of the outer wall and a top cover attached to a top end of the outer wall. The casing defines a receiving space therein for receiving an impeller therein. A sealed chamber is defined in the casing and isolated from the receiving space. A motor driving unit is received in the sealed chamber and magnetically interacts with the impeller to drive the impeller to rotate. The motor driving unit comprises a motor having a stator and a printed circuit board electrically connecting with the stator. The top cover covers the motor driving unit and thermally contacts with electronic components on the printed circuit board for dissipating heat generated by the electronic components when the motor driving unit is operated.

17 Claims, 6 Drawing Sheets

U.S. PATENT DOCUMENTS

| | | | |
|---|---|---|---|
| 7,044,721 B2* | 5/2006 | Horng et al. | 417/423.7 |
| 7,124,811 B2* | 10/2006 | Crocker et al. | 165/104.33 |
| 7,154,750 B2* | 12/2006 | Li et al. | 361/695 |
| 7,274,566 B2* | 9/2007 | Campbell et al. | 361/699 |
| 7,278,468 B2* | 10/2007 | Joshi et al. | 165/80.4 |
| 7,280,357 B2* | 10/2007 | Tomioka et al. | 361/699 |
| 7,345,884 B2* | 3/2008 | Horng et al. | 361/719 |
| 7,537,047 B2* | 5/2009 | Lai et al. | 165/80.4 |
| 2004/0234399 A1* | 11/2004 | Lopatinsky et al. | 417/423.7 |
| 2005/0103472 A1* | 5/2005 | Lofland et al. | 165/80.4 |
| 2005/0217828 A1* | 10/2005 | Tomioka et al. | 165/104.31 |
| 2005/0226745 A1* | 10/2005 | Seko et al. | 417/423.14 |
| 2005/0232795 A1* | 10/2005 | Seko et al. | 417/423.14 |
| 2005/0241312 A1* | 11/2005 | Hata et al. | 60/649 |
| 2005/0244292 A1* | 11/2005 | Tomioka et al. | 417/423.7 |
| 2006/0185378 A1* | 8/2006 | Duan et al. | 62/259.2 |
| 2006/0185829 A1* | 8/2006 | Duan et al. | 165/104.33 |
| 2006/0185830 A1* | 8/2006 | Duan | 165/104.33 |
| 2006/0191667 A1* | 8/2006 | Chen et al. | 165/80.4 |
| 2007/0029069 A1* | 2/2007 | Duan | 165/80.4 |
| 2008/0075611 A1* | 3/2008 | Lai et al. | 417/420 |

* cited by examiner

MINIATURE LIQUID COOLING DEVICE HAVING AN INTEGRAL PUMP

BACKGROUND OF THE INVENTION

1. Field of the Invention

The present invention relates generally to a liquid cooling device for heat-generating electronic components, and more particularly to a miniature liquid cooling device having an integral pump therein.

2. Description of Related Art

With continuing development of the computer technology, electronic packages such as central process units (CPUs) are generating more and more heat that requires immediate dissipation. The conventional heat dissipating devices such as combined heat sinks and fans do not have sufficient heat dissipation capacity to serve the needs of modern electronic packages. Liquid cooling systems are therefore increasingly being used in computer technology to cool these electronic packages.

A related liquid cooling system comprises a heat absorbing unit for absorbing heat from a heat source, and a heat dissipating unit which is filled with liquid. The liquid undergoes heat exchange with the heat absorbing unit, thereby taking away the heat of the heat absorbing unit when the liquid is circulated. Typically, a miniature pump is used to circulate the liquid in the liquid cooling system.

The miniature pump comprises an impeller and a motor for driving the impeller to rotate so as to circulate the liquid. The motor used therein generally comprises a printed circuit board having a plurality of circuits to control the motor. In conventional use, the motor with the printed circuit board is received in a sealed chamber. Thus large amounts of heat generated by electronic components of the printed circuit board are dispersed in the sealed chamber, which leads to high temperatures in the sealed chamber. Excessively high temperature causes a reduction in operational lifespan of the printed circuit board and enormously affects performance of the printed circuit board.

A liquid cooling system capable of overcoming the above shortcoming is therefore necessary.

SUMMARY OF THE INVENTION

A miniature liquid cooling device in accordance with an embodiment of the present invention includes a casing having an outer wall, a bottom base attached to a bottom end of the outer wall and a top cover attached to a top end of the outer wall. The casing defines a receiving space therein for receiving an impeller therein. A sealed chamber is defined in the casing and isolated from the receiving space. A motor driving unit is mounted in the sealed chamber and magnetically interacts with the impeller to drive the impeller to rotate. The motor driving unit comprises a motor having a stator and a printed circuit board electrically connecting with the stator. A plurality of electronic components are mounted on the printed circuit board. The top cover covers the motor driving unit and contacts with the electronic components of the printed circuit board for dissipating heat generated by the electronic components when the motor driving unit is operated.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
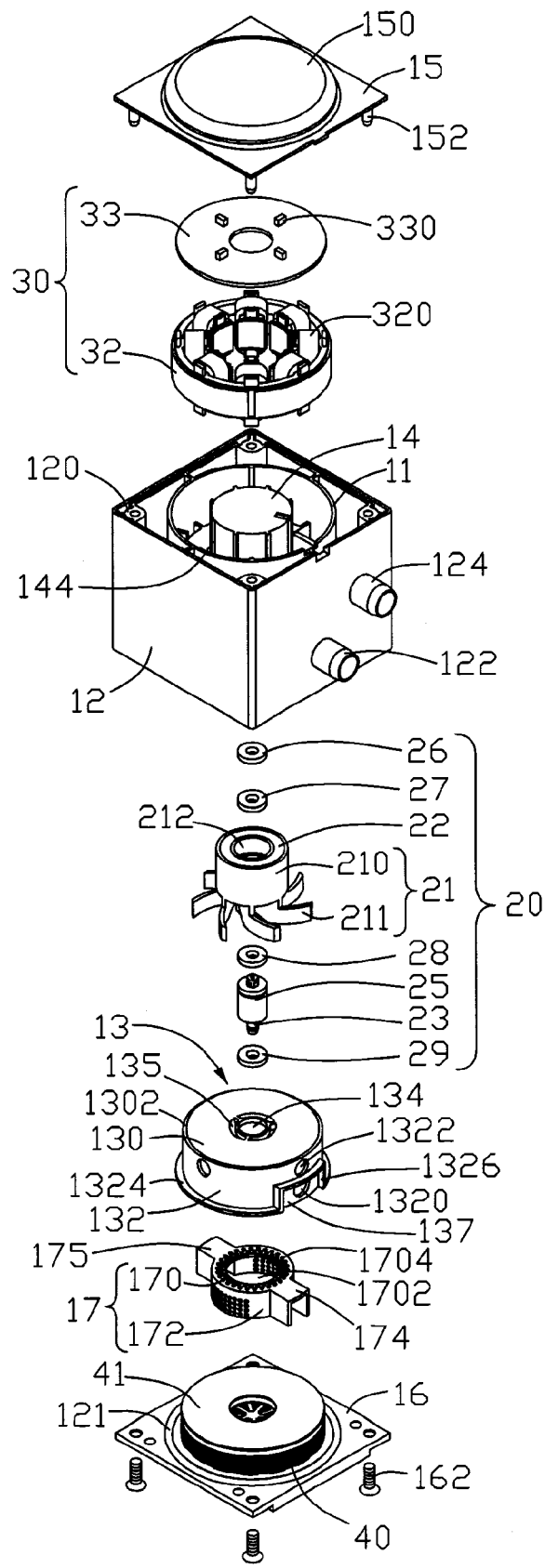
FIG. 1 is an exploded, isometric view of a miniature liquid cooling device according to a preferred embodiment of the present invention.
Figure 2:
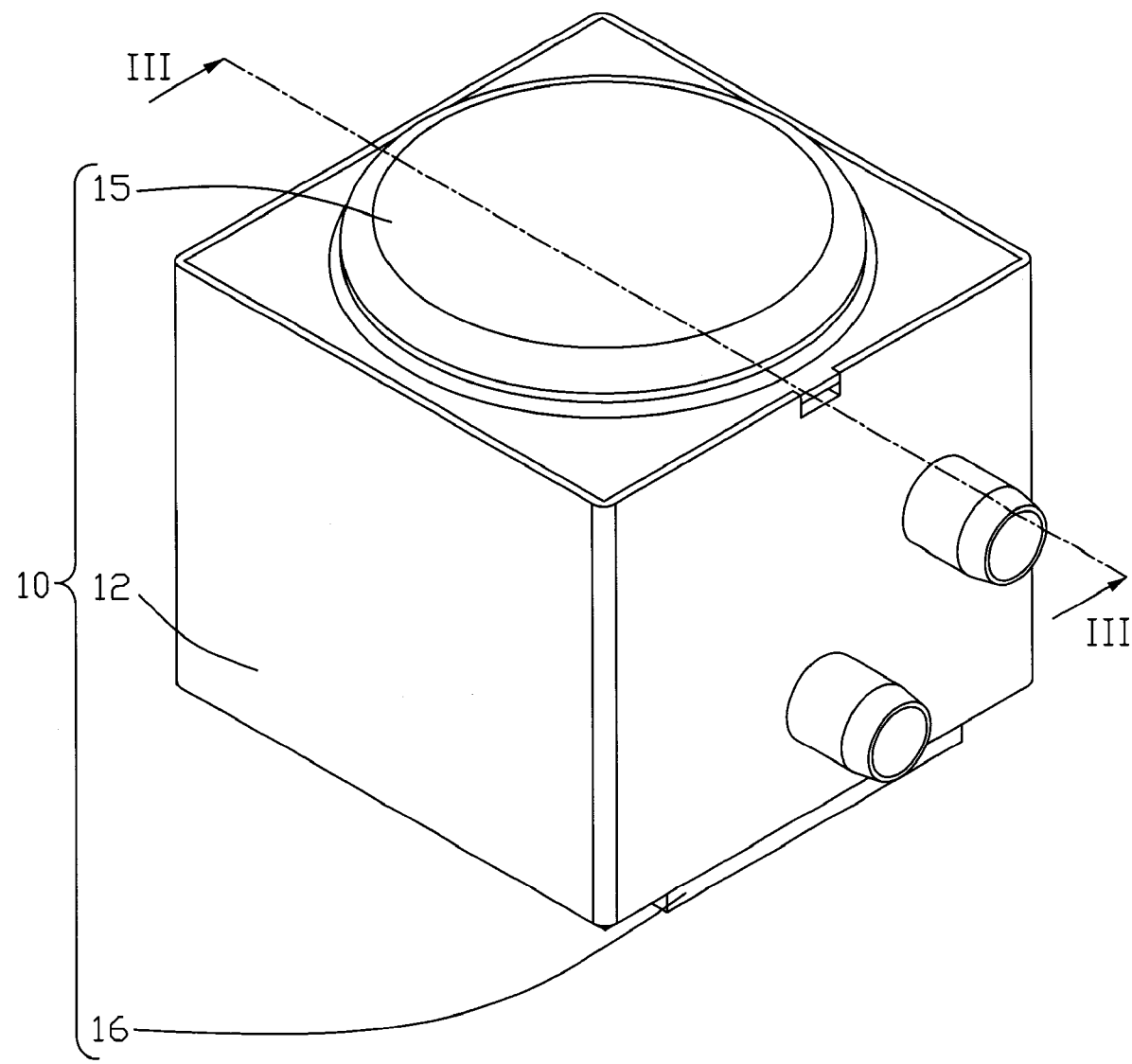
FIG. 2 is an assembled view of the miniature liquid cooling device of FIG. 1.
Figure 3:
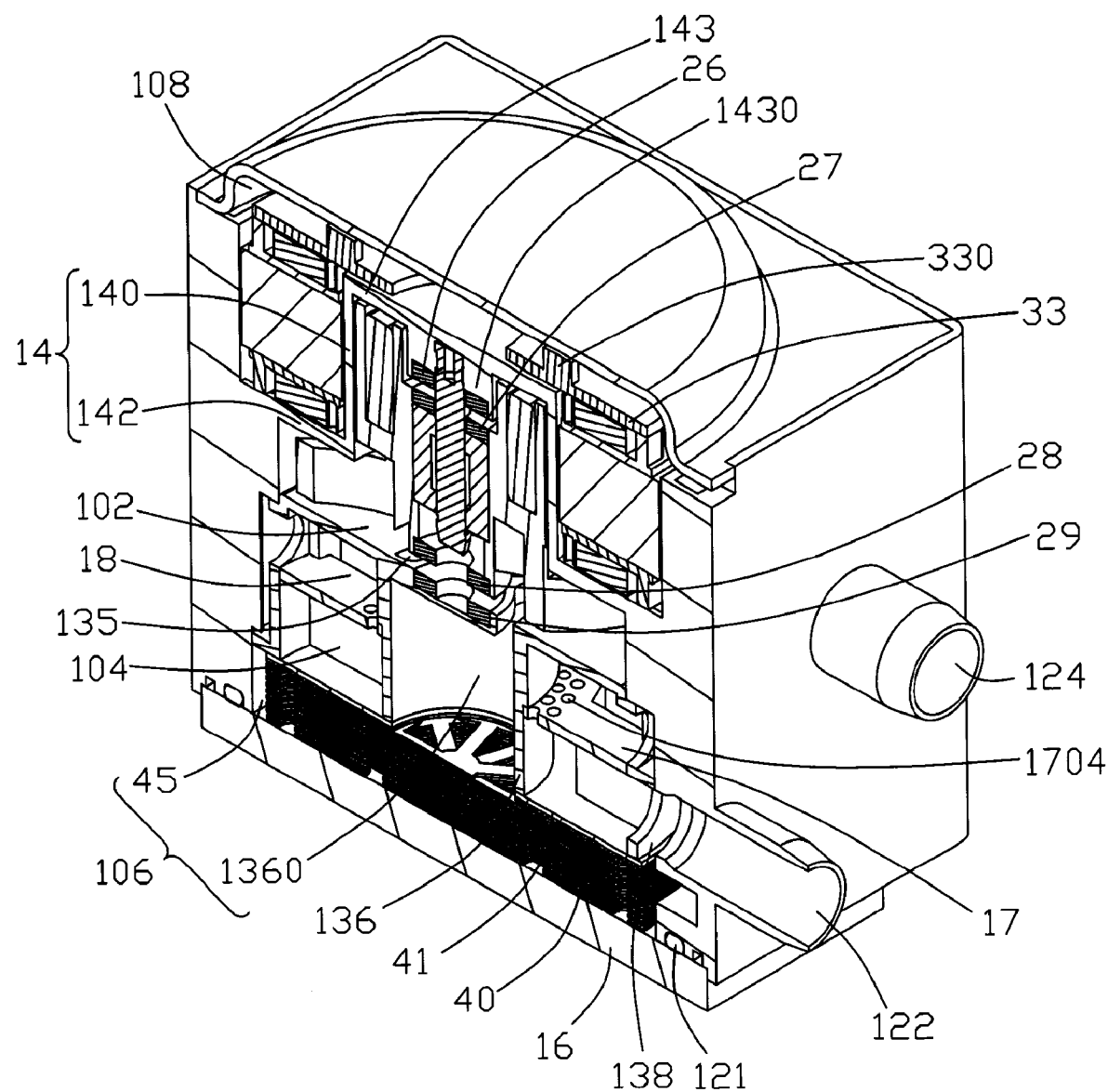
FIG. 3 is a cross sectional view taken along line III-III of FIG. 2.

Referring to FIGS. 1-3, a miniature liquid cooling device in accordance with a preferred embodiment of the present invention comprises a casing 10 having an inner space, and a liquid circulating unit 20, a motor driving unit 30, a filter 17 and a heat-absorbing member 40 received in the inner space of the casing 10. The liquid cooling device can be directly attached to a heat-generating electronic component (not shown) mounted on a printed circuit board (not shown).

The casing 10 has a cube-shaped configuration. A hollow main body 14 is received in the inner space of the casing 10, for accommodating the liquid circulating unit 20 therein. The casing 10 comprises an outer wall 12, a top cover 15 attached to a top end of the outer wall 12, and a bottom base 16 attached to a bottom end of the outer wall 12. A hollow cylinder 11 connecting with the outer wall 12 and the main body 14 is received in the inner space of the casing 10 and located between the outer wall 12 and the main hollow body 14. A sealing ring 121 is disposed between the outer wall 12 and the bottom base 16 to prevent liquid leakage. The outer wall 12 of the casing 10 has four hollow posts 120 formed at four corners thereof. An inlet 122 is formed on the outer wall 12 of the casing 10 for allowing the liquid to enter the casing 10. An outlet 124 above the inlet 122 is also formed on the outer wall 12 of the casing 10 for allowing the liquid to exit the casing 10. The main body 14 is used for isolating the motor driving unit 30 from the liquid and comprises first and second parts 140, 142 each having a cylindrical configuration. The first part 140 has a top wall 143. A plurality of ribs 144 are formed on an outer surface of the first part 140 along an axial direction. The second part 142 is located below the first part 140, communicates with the first part 140 and has a diameter larger than that of the first part 140. A sidewall (not labeled) of the second part 142 connects with the cylinder 11.

The bottom base 16 has a rectangular configuration. The bottom base 16 is mounted on the bottom end of the outer wall 12 by bringing four screws 162 to extend through the base 16 and screw into bottom ends of posts 120 of the outer wall 12. The bottom base 16 serves as a heat-absorbing plate to contact with the heat-generating electronic component and absorb heat generated by the electronic component.

Figure 4:
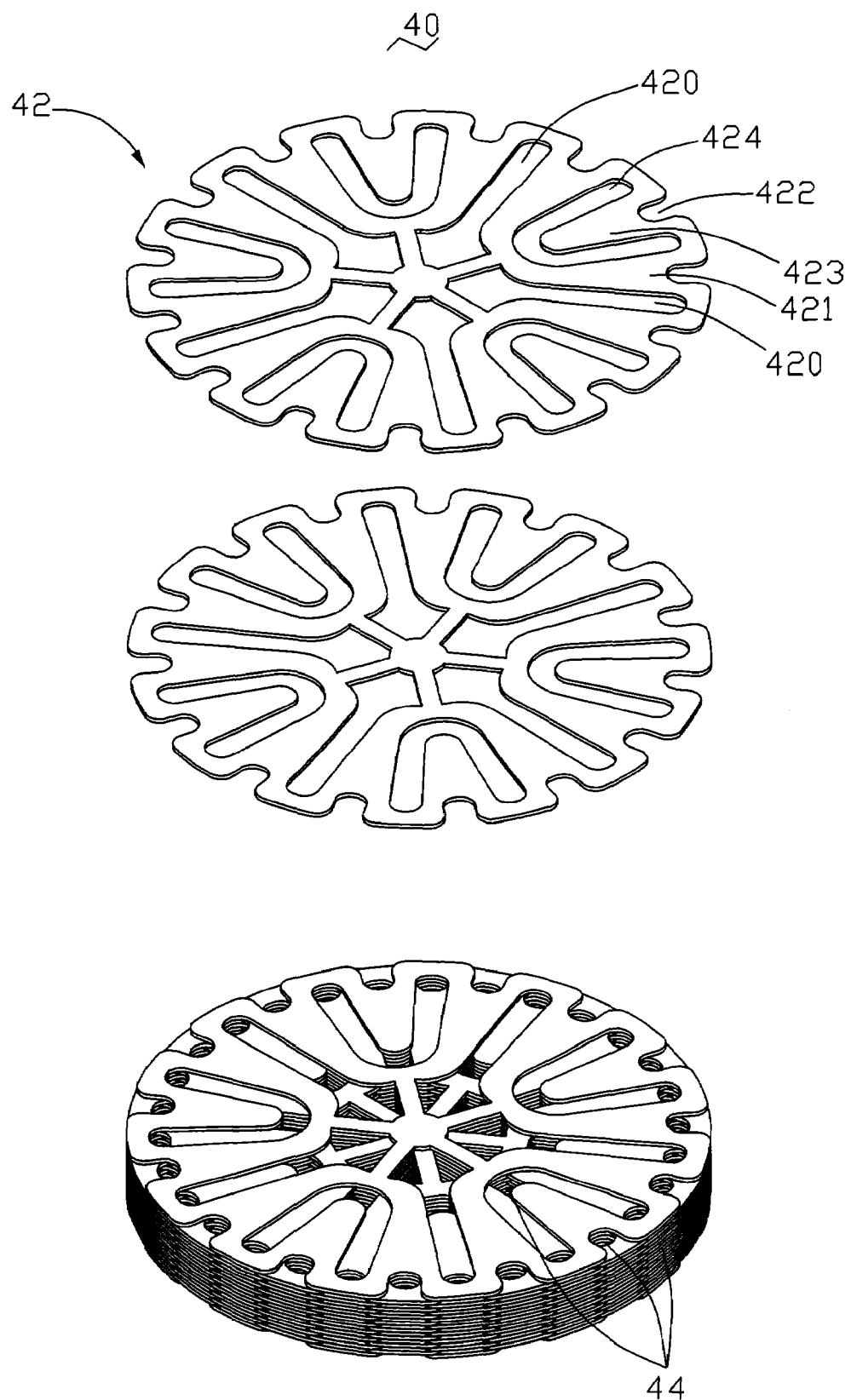
FIG. 4 is a partially exploded and enlarged view of a heat-absorbing member of the miniature liquid cooling device of FIG. 1.

Referring to FIGS. 3 and 4, the heat-absorbing member 40 is mounted on the bottom base 16 for absorbing the heat generated by the electronic component. The heat-absorbing member 40 is made of highly thermally conductive materials such as copper or copper alloys. In this embodiment of the present invention the heat-absorbing member 40 consists of a plurality of copper plates 42. Each of the copper plates 42 has an annular configuration and defines five evenly spaced elongated slots 420 extending along a radial direction. A plurality of evenly spaced cutouts 422 are circumferentially defined at an outer edge of each plate 42. A body 421 is formed and located between adjacent elongated slots 420 of each plate 42. The body 421 defines a substantially V-shaped aperture 424 extending along the radial direction. A tab 423 is enclosed by the V-shaped aperture 424. The tab 423 has a length shorter than that of the slot 420. During assembly of the plates 42, the plates 42 are coaxially aligned with each other and the tabs 423 of each plate 42 are stacked on the elongated slots 420 of an adjacent plate 42 to form a plurality of channels 44. Thus, the plates 42 are stacked together to form the heat-absorbing member 40.

A mounting plate 41 is attached to the heat-absorbing member 40. The mounting plate 41 defines a central hole (not labeled) therein communicating with channels 44 defined in the heat-absorbing member 40.

Figure 5:
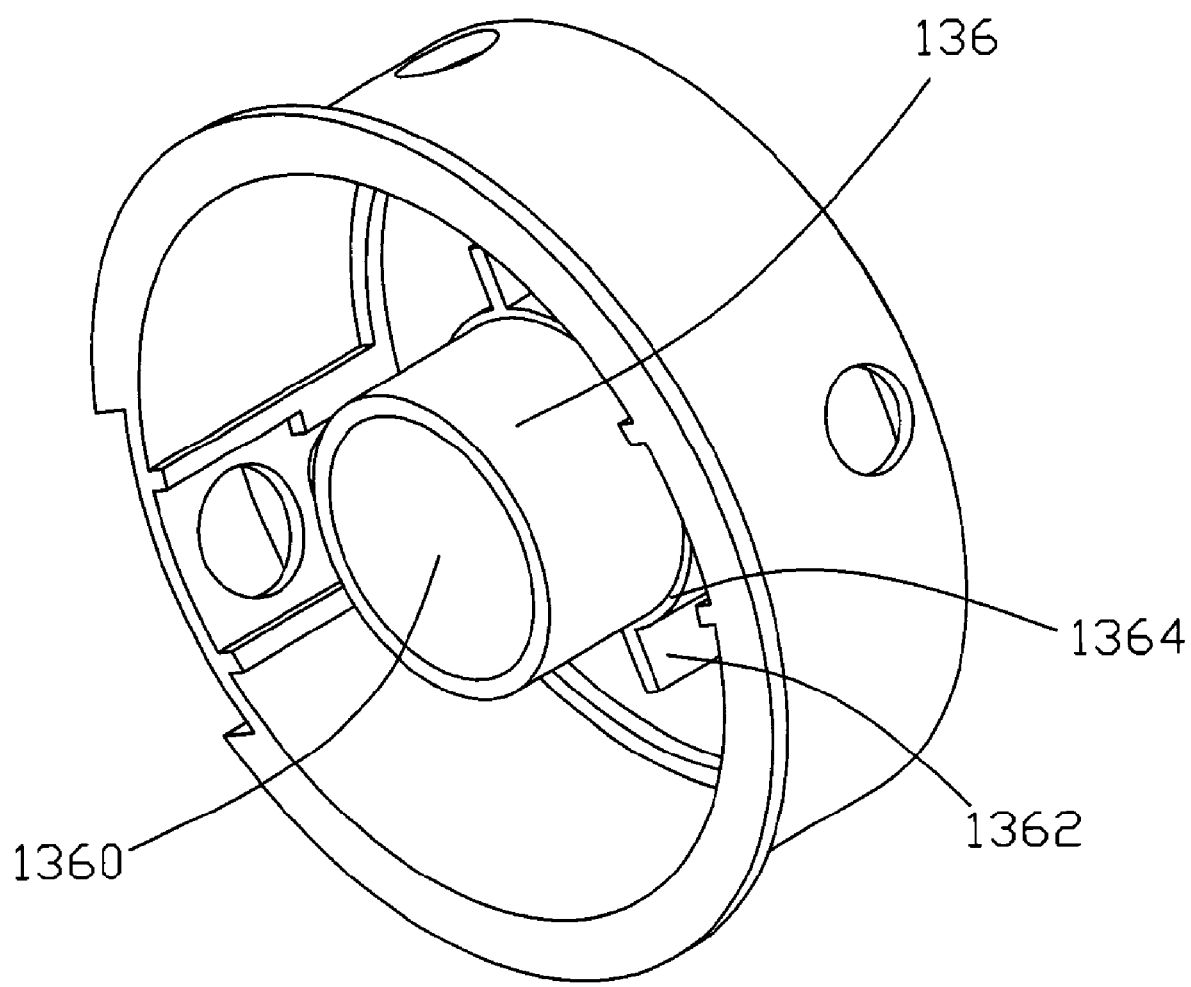
FIG. 5 is an enlarged view of a mask of the miniature liquid cooling device of FIG. 1.
Figure 6:
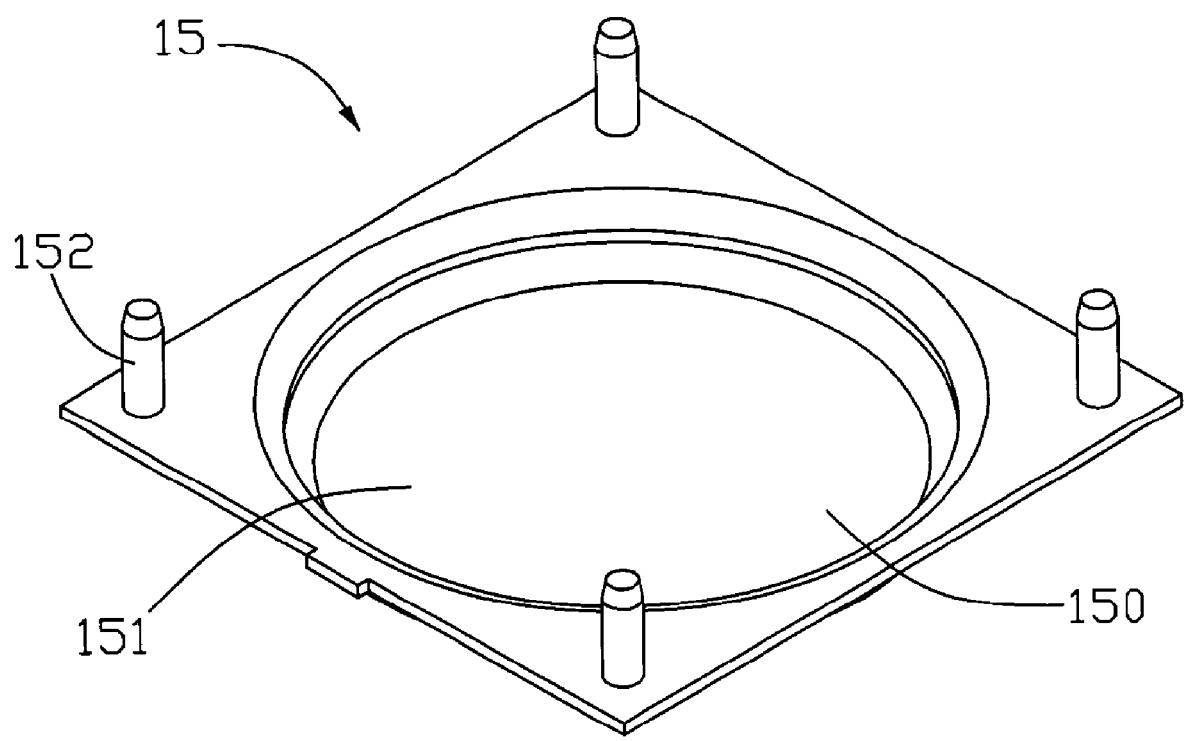
FIG. 6 is an enlarged view of a cover of the miniature liquid cooling device of FIG. 1, but shown from a bottom aspect.

Referring to FIGS. 1 and 3, an air circulating mask 13 is received in the inner space of the casing 10 and sandwiched between a bottom end the second part 142 of the main body 14 and the mounting plate 41. The mask 13 comprises a circular top plate 130 attached to the bottom end of the second part 142 of the main body 14 and a cylindrical sidewall 132 downwardly extending from an edge of the top plate 130. An annular step 1302 located below the top plate 130 is formed at an edge of the top plate 130 for hermetically engaging with the bottom end of the second part 142 of the main body 14. An arced fringe 1324 circumferentially extends from a bottom edge of the sidewall 132, for being embedded in the corresponding portion of the cylinder 11. A reversed U-shaped fringe 1326 connects with two free ends of the arced fringe 1324. An entry area 137 is enclosed by the fringe 1326 and aligned with the inlet 122. An aperture 1320 is defined at a center of the entry area 137, corresponding to the inlet 122. The reversed U-shaped fringe 1326 abuts against the corresponding portion of the cylinder 11 so that a space 138 is defined between the entry area 137 and the cylinder 11 for permitting the liquid to downwardly flow through the heat-absorbing member 40 located below the mask 13. The liquid enters the mask 13 only via the aperture 1320 defined in the entry area 137. A plurality of through holes 1322 are circumferentially defined in the wall 132 and located above the aperture 1320. A supporting cylindrical wall 136 extends from a bottom of the top plate 130 of the mask 13 for abutting against the mounting plate 41 mounted on the heat-absorbing member 40. An inner chamber 1360 is enclosed by the supporting cylindrical wall 136. The supporting cylindrical wall 136 is located around the central hole of the mounting plate 41. Thus, the inner chamber 1360 of the supporting cylindrical wall 136 communicates with the channels 44 of the heat-absorbing member 40. A round downward protrusion 134 is formed at a center of the top plate 130. The top plate 130 corresponding to the inner chamber 1360 defines a plurality of elongated arced through openings 135. The through openings 135 are located adjacent to and circularly around the protrusion 134, and communicate the main body 14 with the inner chamber 1360 for providing passage of the liquid therethrough. Thus, the inner chamber 1360 of the supporting cylindrical wall 136 communicates with the main body 14. Referring to FIG. 5, an annular step 1364 is circularly formed on the supporting cylindrical wall 136. A pair of baffle plates 1362 abutting against the top plate 130 are formed at opposite two sides of the annular step 1364.

The filter 17 is received in the mask 13 and located around the supporting cylindrical wall 136 of the mask 13. The filter 17 comprises a top wall 170 and a cylindrical sidewall 172. A central opening 1702 is defined in the top wall 170 for providing passage of the supporting cylindrical wall 136 of the mask 13. A plurality of orifices 1704 are defined in the top wall 170 and the cylindrical sidewall 172 for providing escape of gas bubbles mixed in the liquid. The top wall 170 abuts against the annular step 1364 and the baffle plate 1362 of the mask 13 to separate the top wall 170 from the top wall 130 of the mask 13 for facilitating escape of the air bubbles therefrom. A pair of brackets 174, 175 are formed at opposite two sides of the sidewall 172. The bracket 174 abuts against the entry area 137 of the mask 13. The bracket 175 abuts against a corresponding inner surface of the sidewall 132 of the mask 13. The bracket 174 is in alignment with the aperture 1320 of the mask 13 so that the liquid can directly enter the filter 17 via the aperture 1320 and the bracket 174.

The liquid circulating unit 20 is received in the main body 14. The liquid circulating unit 20 comprises an impeller 21, a shaft 23 mounted on the top wall 143 of the main body 14 and a bearing 25 pivotably attached to the shaft 23. The impeller 21 comprises a cylindrical hub 210 having a permanent magnet 22 embedded therein and a plurality of curved blades 211 radially extending from a bottom end of the hub 210. The hub 210 has a central through hole 212 for receiving the shaft 23 and the bearing 25 therein. For positioning the shaft 23, the top wall 143 of the main body 14 downwardly forms a shaft support 1430 having a center blind hole (not labeled) receiving a top end of the shaft 23 therein. In the present invention, the impeller 21 uses four annular magnetic spacers 26-29 to control its axial position, wherein the magnetic spacers 27, 28 are respectively received in opposite two ends of the through hole 212 of the impeller 21 and rotate with the impeller 21, the magnetic spacers 26, 29 are respectively received in the shaft support 1430 and the round downward protrusion 134 of the top plate 130 of the mask 13. The magnetic spacers 26, 27 are mounted around the shaft 23, located above the bearing 25 and spaced from each other. The magnetic spacers 28, 29 are located below the bearing 25 and spaced from to each other. The spacers 26, 27 are repulsive to each other, while the spacers 28, 29 are repulsive to each other. Thus, the four magnetic spacers 26-29 properly suspend the impeller 21 in a stable position in the axial direction when the impeller 21 is operated.

In the present invention, the main body 14, the mask 13 and the mounting plate 41 cooperatively divide the casing 10 into a first chamber 102 above the mask 13 and in the main body 14, a second chamber 104 between the top plate 130 of the mask 13 and the mounting plate 41 and outside and around the supporting cylindrical wall 136 of the mask 13, a third chamber 106 consisting of a space 45 below the mounting plate 41 and the inner chamber 1360 of the supporting cylindrical wall 136 of the mask 13 and a fourth chamber 108 above the mask 13 and outside and around the main body 14. The third chamber 106 communicates with the first chamber 102 via the through openings 135 defined in the top plate 130 of the mask 13. The first chamber 102 and the third chamber 106 cooperatively form a work channel for the liquid. In the second chamber 104, a reserve volume 18 is defined by an outer surface of the filter 17 and an inner surface of the mask 13 for reserving the air bubbles. The fourth chamber 108 is a sealed chamber for receiving the motor driving unit 30 therein. The top cover 15 mounted on the outer wall 12 of the casing 10 covers the motor driving unit 30.

The motor driving unit 30 received in the fourth chamber 108 comprises a motor having a stator 32 and a printed circuit board 33 electrically connecting with the stator 32. The stator 32 is mounted around the first part 140 of the main body 14 in the casing 10 and engages with the ribs 144 of the first part 140. The stator 32 is supported by the second part 142 of the main body 14 in an axial direction and supported by the cylinder 11 in a radial direction. The printed circuit board 33 is mounted on the top wall 143 of the main body 14 and electrically connected with the stator 32. The stator 32 has a plurality of coils 320 wrapped thereon. The coils 320 are used for providing a path for a current controlled by the printed circuit board 33 to flow therethrough. A magnetic field is established when the current flows through the coils 320, which interacts with the magnet 22 to cause the impeller 21 to rotate.

The top cover 15 has a square configuration. An upward cap 150 protrudes upwardly from a center of the top cover 15 for covering and contacting with electronic components 330 mounted on the printed circuit board 33. The top cover 15 can be made of highly thermally conductive materials. In this embodiment of the present invention, the top cover 15 is made of aluminum for dissipating heat generated by the electronic components 330. To ensure intimate contact between the electronic components 330 and the cap 150 of the top cover 15, a layer of thermal interface material 151 is usually spread on a bottom absorption surface of the cap 150 of the top cover 15 to improve heat-transmission between the top cover 15 and the electronic components 330 of the printed circuit board 33. The heat generated by the electronic components 330 causes the thermal interface material 151 to become more liquid, enabling the thermal interface material 151 to fill in the air gap formed between the cap 150 and the electronic components 330, thereby improving heat-transmission efficiency between the top cover 15 and the electronic components 330. Four poles 152 extend downwardly from four corners of the top cover 15, for being engaged in top ends of the hollow posts 120 of the outer wall 12 of the casing 10.

In operation of the liquid cooling device, the liquid is driven by the rotation of the impeller 21 to flow from a liquid source (not shown) into the filter 17 mounted in the second chamber 104 via the inlet 122 and the bracket 174 of the filter 17. The liquid entering the second chamber 104 continues to move due to inertia along an inner surface of the filter 17, but slows due to gravity; simultaneously, the air bubbles mixed in the liquid escape from the orifices 1704 defined in the filter 17 and are maintained in the reserve volume 18 of the mask 13. Due to the through holes 1322 defined in the wall 132 of the mask 12, capacity of the reserve volume 18 for reserving the air bubbles can be increased. The air bubbles escaping from the orifices 1704 can not flow back to the filter 17 and are reserved in the reserved volume 18. After circularly flowing through the filter 17, the liquid returns to the entry area 137 of the mask 13 and flows downwardly along an edge of the heat-absorbing element 40 to the third chamber 106 via the aperture 1320. The bottom base 16 intimately contacting with the electronic component absorbs the heat generated by the electronic component. The heat is then transferred to the liquid contained in the third chamber 106. The liquid exchanges heat with the heat-absorbing member 40 via the channels 44 of the heat-absorbing member 40 and flows towards the first chamber 102 via the through openings 135 of the mask 13. The liquid in the first chamber 102 is finally discharged out of the first chamber 102 via the outlet 124 by a centrifugal force caused by rotation of the impeller 21. During the operation of the liquid cooling device, the impeller 21 is driven by the motor driving unit 30. When the motor driving unit 30 is operated, the electronic components 330 mounted on the printed circuit board 33 of the motor driving unit 30 generate large amounts of heat. By the provision of the aluminum top cover 15 contacting with the printed circuit board 33, the heat of the printed circuit board 33 is dissipated by the top cover 15 to surrounding atmosphere. Thus a risk of a damage of the printed circuit board 33 is prevented.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid cooling device, comprising:
    a casing having an outer wall, a bottom base attached to a bottom end of the outer wall and a top cover attached to a top end of the outer wall, the casing comprising a liquid inlet, a liquid outlet above the liquid inlet and a receiving space therein;
    an impeller rotatably mounted in the receiving space, wherein when the impeller rotates liquid is driven to flow into the receiving space via the liquid inlet and out of the receiving space via the liquid outlet, a magnet is attached to the impeller;
    a sealed chamber defined in the casing and isolated from the receiving space;
    a motor driving unit received in the sealed chamber and magnetically interacting with the magnet attached to the impeller to drive the impeller to rotate, the motor driving unit comprising a motor having a stator and a printed circuit board electrically connecting with the stator, a plurality of electronic components mounted on the printed circuit board; and
a mask received in the casing and comprising a top plate and a cylindrical sidewall extending from an edge of the top plate, the cylindrical sidewall defining an aperture corresponding to the inlet;
    wherein the top cover covers the motor driving unit and contacts with the electronic components of the printed circuit board for dissipating heat generated by the electronic components when the motor driving unit is operated.

2. The liquid cooling device as described in claim 1, wherein the top cover has an upward cap protruding upwardly from a center thereof for covering and contacting the electronic components mounted on the printed circuit board.

3. The liquid cooling device as described in claim 2, wherein a layer of thermal interface material is spread on a bottom surface of the cap of the top cover to contact the electronic components mounted on the printed circuit board.

4. The liquid cooling device as described in claim 1, wherein the top cover is made of aluminum.

5. The liquid cooling device as described in claim 1, wherein the receiving space comprises a first chamber, the sealed chamber surrounding the first chamber, the impeller being received in the first chamber.

6. The liquid cooling device as described in claim 5, further comprising a heat-absorbing member received in the receiving space and mounted on the bottom base of the casing, the heat-absorbing member defining a plurality channels therein communicating with the first chamber.

7. The liquid cooling device as described in claim 6, wherein the heat-absorbing member comprises a plurality of annular plates coaxially stacked together.

8. The liquid cooling device as described in claim 6, further comprising a mounting plate mounted on the heat-absorbing member, the mounting plate defining a central hole communicating with the channels of the heat-absorbing member.

9. The liquid cooling device as described in claim 8, wherein the mask is located between the impeller and the mounting plate.

10. The liquid cooling device as described in claim 9, comprising a filter received in the mask, the filter having a bracket located corresponding to the inlet and the aperture of the mask, the filter defining a plurality of orifices to provide an escape of air bubbles mixed in the liquid for preventing the air bubbles from entering the first chamber with the liquid.

11. The liquid cooling device as described in claim 10, wherein a supporting cylindrical wall extends from a bottom of the top plate of the mask, the supporting cylindrical wall of the mask abutting against the mounting plate and around the central hole of the mounting plate, an inner chamber being enclosed by an inner surface of the supporting cylindrical wall, the inner chamber communicating with the first chamber and the channels of the heat-absorbing member via the central hole of the mounting plate.

12. The liquid cooling device as described in claim 11, wherein the filter is mounted around the supporting cylindrical wall of the mask.

13. The liquid cooling device as described in claim 12, wherein the receiving space further comprises a second chamber between the top plate of the mask and the mounting plate and outside and around the supporting cylindrical wall of the mask, and a third chamber comprising a space below the mounting plate and the inner chamber of the supporting cylindrical wall of the mask, wherein the first and third chambers are in fluidic communication with each other and cooperatively form a work channel for the liquid.

14. The liquid cooling device as described in claim 13, wherein a main hollow body is received in the casing for isolating the motor driving unit from the liquid, the top plate of the mask hermetically attached to a bottom end of the main hollow body, and the top plate of the mask and an inner surface of the main hollow body forms the first chamber.

15. The liquid cooling device as described in claim 14, wherein a shaft is mounted on a top wall of the main body, a bearing is pivotably attached to the shaft, and the impeller is attached to the bearing.

16. The liquid cooling device as described in claim 15, wherein the impeller comprises two pairs of annular magnetic spacers to control its axial position, and the first pair of magnetic spacers are spaced positioned above the bearing and opposite to each other, and the second pair of magnetic spacers are spaced positioned below the bearing and opposite to each other.

17. The liquid cooling device as described in claim 16, wherein the stator of the motor driving unit is mounted around the main hollow body, the printed circuit board being mounted on the stator.

\* \* \* \* \*